United States Patent
Spaulding

(10) Patent No.: US 7,047,631 B1
(45) Date of Patent: May 23, 2006

(54) METHOD FOR AUTOMATABLE INSERTION OR REMOVAL OF INTEGRATED CIRCUIT BOARD

(75) Inventor: Robert Spaulding, Santa Rosa, CA (US)

(73) Assignee: Cisco Technology, Inc., San Jose, CA (US)

( * ) Notice: Subject to any disclaimer, the term of this patent is extended or adjusted under 35 U.S.C. 154(b) by 563 days.

(21) Appl. No.: 10/099,493

(22) Filed: Mar. 13, 2002

(51) Int. Cl.
*H05K 3/30* (2006.01)

(52) U.S. Cl. .............................. 29/832; 29/834; 29/830; 29/757; 29/729; 29/709

(58) Field of Classification Search .......... 29/739–743, 29/759, 760, 832, 833, 834–837, 25.01, 592.1, 29/593, 764, 842, 709–722; 294/2, 64.1; 414/737, 752.1, 752; 901/40, 6; 156/567; 324/754–758; 361/767, 777
See application file for complete search history.

(56) References Cited

U.S. PATENT DOCUMENTS

| | | | |
|---|---|---|---|
| 4,304,514 A | 12/1981 | Pfaff | 29/741 |
| 4,307,510 A | 12/1981 | Sawyer et al. | 29/764 |
| 4,439,917 A | 4/1984 | Pearson | 29/825 |
| 4,660,282 A | 4/1987 | Pfaff | 29/829 |
| 4,719,694 A | 1/1988 | Herberich et al. | 29/703 |
| 4,866,838 A * | 9/1989 | Porter | 29/741 |
| 5,062,016 A | 10/1991 | Zupancic | 360/97.01 |
| 5,152,052 A | 10/1992 | Rantala et al. | 29/764 |
| 5,230,143 A | 7/1993 | Karlovich | 29/764 |
| 5,240,170 A * | 8/1993 | Nishida et al. | 228/180.21 |
| 5,267,395 A * | 12/1993 | Jones et al. | 29/829 |
| 5,348,316 A * | 9/1994 | Lin | 279/3 |
| 5,870,820 A * | 2/1999 | Arakawa et al. | 29/740 |
| 5,951,720 A * | 9/1999 | Arakawa et al. | 29/25.01 |
| 6,018,867 A | 2/2000 | Boe | 29/762 |
| 6,463,359 B1 * | 10/2002 | Fischer | 700/254 |
| 2004/0074525 A1* | 4/2004 | Widman et al. | 134/34 |

* cited by examiner

*Primary Examiner*—Minh Trinh
(74) *Attorney, Agent, or Firm*—Campbell Stephenson Ascolese LLP

(57) ABSTRACT

A method for the automatable insertion or removal of an integrated circuit board is disclosed. One or more linear actuators or similar devices are coupled to one or more cards of an electronic device (e.g., a telecommunications switch or the like) by one or more brackets, to permit substantially automatic card withdrawal/insertion cycles. A controller is operably coupled to the actuators. The controller controls the actuators to operate through a plurality of cycles in a substantially unattended fashion. Measurement and recording or logging systems can measure the occurrence or duration of service disruptions and maintain a log of test results.

8 Claims, 6 Drawing Sheets

METHOD FOR AUTOMATABLE INSERTION OR REMOVAL OF INTEGRATED CIRCUIT BOARD

The present invention relates to a system, method and apparatus which can automatically insert and/or remove integrated circuit (IC) boards or cards into or from a chassis of an electronic device and in particular a device which can be configured for repeated insertion/removal cycles such as may be used for testing or certifying tolerance of hardware or software to board insertion/removal.

BACKGROUND INFORMATION

Many electronic devices are configured for receiving one or more integrated circuit boards or "cards" typically having pins or similar connectors mating with edge pin receivers in one or more card-receiving slots. Non-exhaustive examples of such electronic devices include telecommunication devices such as switches, network devices such as routers, hubs, and the like, computers, and so forth.

Some electronic devices include two or more cards configured as a "protection group" wherein, upon removal or failure of a card in the group, other cards or circuitry in the protection group can (preferably automatically) take over some or all functions of the removed or disabled card (albeit possibly with some loss of speed or performance) so as to substantially avoid loss of data and/or loss of telecommunication or network function.

Accordingly, it would be useful to provide a system, method and apparatus which can assist in determining whether software and/or apparatus which is intended to deal with card failures or removals, in fact operates reliably and properly.

SUMMARY OF THE INVENTION

The present invention is directed to a system, method and apparatus which can, in a repeatable fashion, remove one or more selected IC boards or cards and, preferably, can reinsert the cards through multiple cycles. The apparatus preferably operates in conjunction with, or includes, a system for recording the results of such removal/insertion operations and/or which records the indications of the insertions/removal tests or operations that were performed and the results thereof.

The system, method and apparatus of the present invention provides a number of advantages over manual insertion/removal of cards. Because manual insertion/removal can be a tedious process and involve repetitive motion (and consequent potential health issues), the number of insertions/removal tests and/or the rate at which such tests can be manually performed is limited. The system, method and apparatus of the present invention makes it possible to conduct a relatively large number of insertion/removal cycles so as to perform sufficient tests to achieve a desired level of confidence in the reliability of the apparatus or software which handles card removal or failure events. By providing a system, method and apparatus that achieves a high rate of insertion/removal cycles, the total time needed for testing a system can be reduced. In one embodiment, the system can be configured to insert/remove various different cards at different times and/or different combinations of two or more cards so that relatively complex tests involving predetermined and/or random or unpredictable combinations or sequences of card removal/insertions can be readily achieved by programming the insertion/removal device, making it feasible to perform test sequences which may be, because of their complexity, infeasible for manual execution. Furthermore, the ability of the present invention to perform or facilitate the recording of the tests performed and/or the results makes it feasible to perform relative complex test sequences which may be difficult or impossible to record and measure in a manual fashion, at least within a desirably short amount of time.

According to one embodiment, one or more actuators such as one or more linear actuators, are coupled to at least one card. Preferably the system is configured to make it possible, if desired, to couple actuators to substantially any card in a chassis and/or to two or more cards in the chassis (for sequential or simultaneous removal/insertion). In one example an electromagnetic linear actuator has an arm mounted to a card and a body mounted to a frame which, in turn, is coupled to the chassis of the electronic device.

Preferably the system and apparatus for controlling the actuators is programmable so that the timing and/or sequence of actuator operations can be determined, as appropriate for the tests being performed. In one embodiment, a personal computer (PC) or other computer (preferably in addition to other functions, e.g. as described below) can receive or store data, and/or can be programmed for directly or indirectly controlling the actuators e.g. transferring commands, signals or data to a control board communicating with a firmware controller coupled to the linear actuators.

In one aspect, linear actuators or similar devices are coupled to one or more cards of an electronic device such as a telecommunications switch or the like, to permit substantially automatic card withdrawal/insertion cycles, e.g., for testing proper operation of a protection group in a switch. The actuators are preferably controlled to operate through a plurality of cycles in a substantially unattended fashion. Measurement and recording or logging systems can measure the occurrence or duration of service disruptions and maintain a log of test results.

DETAILED DESCRIPTION OF THE PREFERRED EMBODIMENTS

Figure 1:
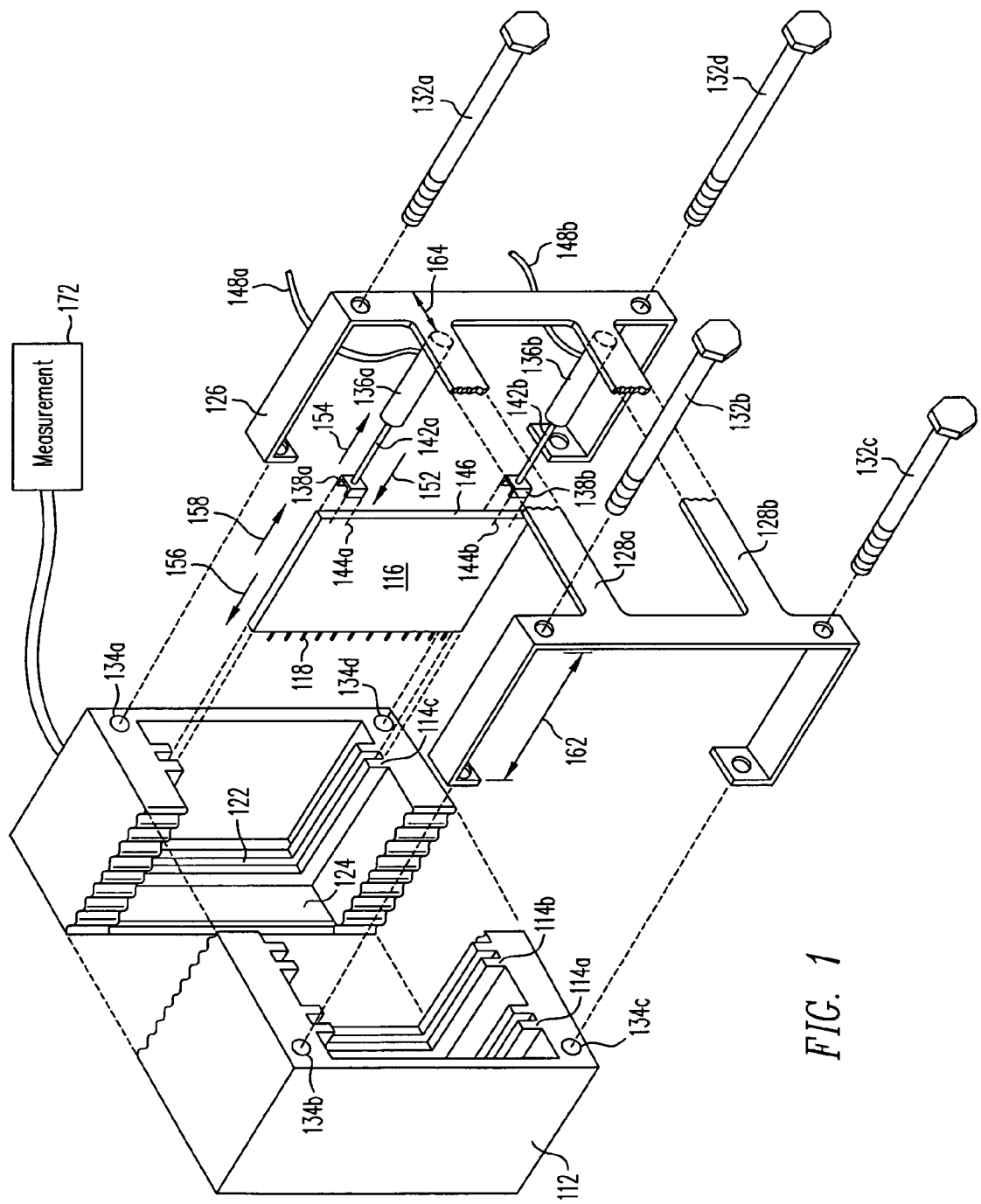
FIG. 1 is a exploded, perspective, partially cutaway view of an apparatus for coupling to an electronic device according to an embodiment of the present invention.

As seen in FIG. 1, the chassis 112 of an electronic device includes a plurality of card slots 114a,b,c configured to receive and guide edges of an IC board or card 116 so as to couple card pins 118 to corresponding pin receivers (not shown) in slots or receivers 122, e.g., formed in a backplane 124 of the electronic device. Although for clarity only three card slots 114a,b,c are illustrated, typically multiple card slots are available. In one embodiment, 17 card positions are available. Although one card 116 is illustrated in FIG. 1, typically there will be multiple cards, which may be operatively configured in one or more protection groups, as described above.

In the embodiment depicted in FIG. 1, a bracket 126 having one or more cross members 128a,b is coupled to the chassis 112 by a plurality of connectors such as bolts 132a,b,c,d engaged in bolt holes 134a,b,c,d. Linear actuators 136a,b are coupled, respectively, to the upper and lower cross members of 128a,b in positions such that brackets 138a,b (which may include, e.g. a pin clevis) coupled to the end of the movable actuator arms 142a,b can be coupled at upper and lower positions 144a,b of the card 116 free edge 146. In general, it is important that the motors be aligned with respect to the card to provide a push/pull force parallel to the card side edges and parallel to the card plane, and that the actuators coupled to a given card be aligned parallel to one another. The linear actuators 136a,b may be coupled to the arms or cross members 128a,b by any of a number of methods or devices including welding, bolting, coupling to sockets and the like. The linear actuators 136a,b receive or transmit control signals, data or feedback signals, power and the like via one or more cables 148a,b. Because the arm brackets 138a,b are coupled to the board 116, when the linear actuator is controlled so as to extend 152 or retract 154 the arm 142a,b, this will result in motion of the board 116 in an insertion direction 156 (towards the backplane 124) or a withdrawal or removal direction 158 (away from the backplane 124). The amount of arm extension 152 or withdrawal 154 will depend on the desired test operations. In many tests, it is anticipated it will only be necessary to move the arm 152, 154 an amount sufficient to disengage the pins 118 from the pin receptacles in the backplane slot 122 (typically an amount less than about an inch). In other embodiments, it may be desirable to withdraw the card 116 substantially fully from the side edge slots 114c, e.g., to permit manual or automatic insertion of a different board into the slot.

The insertion 156 is preferably controlled so as to assure that the card 116 will not be moved in the insertion direction 156 substantially beyond the movement necessary to engage the pins 118, since further movement could potentially damage the card 116 and/or backplane 124. In one embodiment, multiple levels of protection against such damage are provided. In one embodiment, there is at least one, and preferably two or more, levels of software protection against undesirably large insertion movement and also, preferably, a physical protection such as a limit switch, on or coupled to the actuator, which disengages the actuator if it moves beyond a predefined position. In some embodiments, the actuators 136a,b may be positioned such that they are incapable of extending the arms 142a,b to such an extent that damage is possible, i.e., such that the limit of movement is just short of the backplane 124.

Preferably, the linear actuators 136a,b are controllable to within a high degree of accuracy such as providing for card movement 116 to desired positions within a tolerance of a few thousandths of an inch. The bracket 126 is configured such that the actuators 136a,b can be positioned the desired axial distance 162 from the chassis 112 and can be positioned at lateral locations or distances 164 so as to desirably align with card slots 114c.

Although FIG. 1 depicts two actuators 136a,b coupled to a card 116, it is possible to provide configurations in which more or fewer actuators are used for each card. If a single actuator is used for moving a card, the actuator should be positioned to achieve substantially equal friction, with respect to the card slot 114c, on either side edge. However, at present it is generally preferred to provide at least two actuators per card to avoid cocking of the card (e.g. arising from friction at the card deges) which could lead to pin damage. Although the embodiment depicted in FIG. 1 shows actuators aligned with only a single card slot 114c, it is possible to configure embodiments in which one or more actuators are aligned with each of two or more of the card slots, or, in some embodiments, with each of the card slots (e.g., so that the actuators can be controlled for inserting/removing any desired card).

A number of devices could, at least, theoretically, be used as actuators 136a,b. In one embodiment, the actuators are electrical or electromagnetic actuators, preferably powered by DC power (e.g., 20 volt DC power). Preferably, the actuators 136a,b are sufficiently small (e.g., have a sufficiently small diameter) that they can be positioned aligned with two or more adjacent card slots 114a, 114b without interfering with one another.

Figure 5:
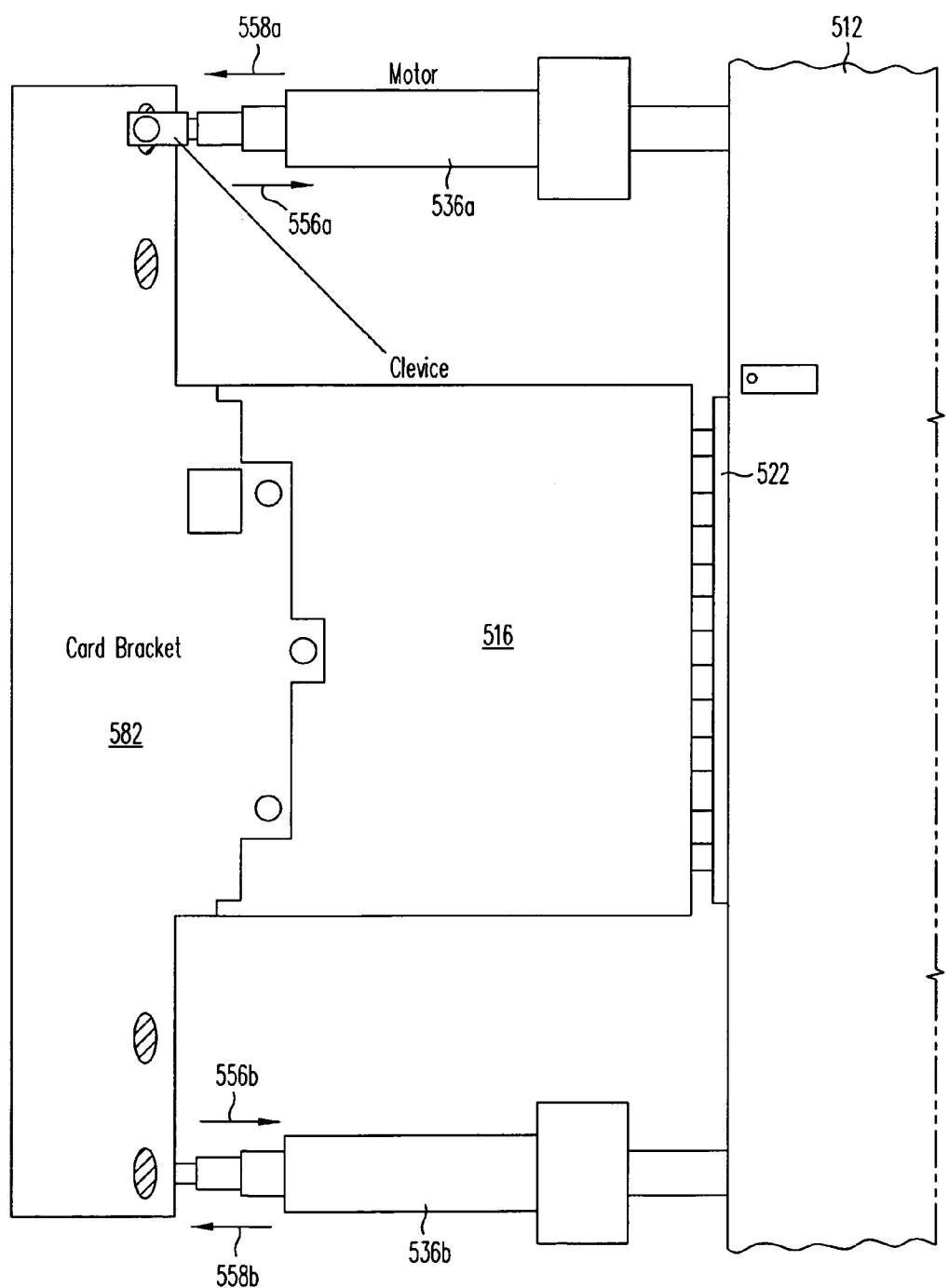
FIG. 5 is a side elevational view of a card puller bracket coupled to a card, according to an embodiment of the present invention.

In another embodiment, depicted in FIG. 5, each card 516 is coupled to a generally planar card puller 582. linear actuators 536a,b are mounted between the upper and lower corners of the card puller 582 and the chassis or box 512 which holds the card socket 522. the linear actuators are controlled to move outwardly 558a,b, to move the puller 582 so as to withdraw the card 516 from the socket 522, or inwardly 556a,b to move the puller 582 so as to insert the card 516 into the socket 522.

Figure 2:
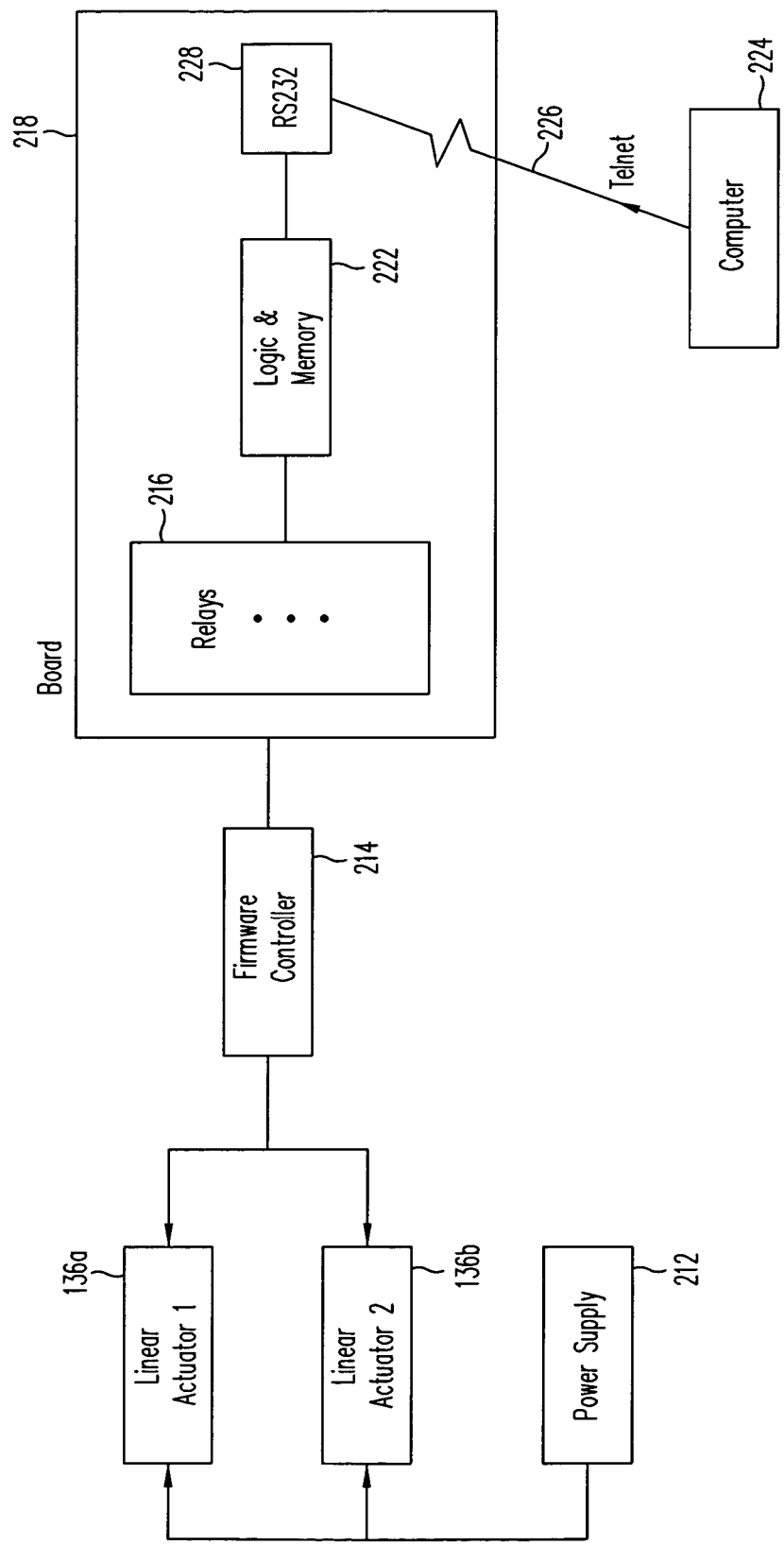
FIG. 2 is a block diagram of an actuator control system according to an embodiment of the present invention.

In one embodiment, as depicted in FIG. 2, the linear actuators 136a,b receive power directly or indirectly from a power supply 212 (such as a 20 volt DC power supply supplying power to the actuator controller which steps down power as necessary and further provides power to the linear actuators). Additional power supplies, e.g. for the relays (described below) can also be provided.

Preferably the linear actuators 136a,b receive control signals for controlling extension 152 and retraction 154 from a controller such as a firmware controller 214. In one embodiment all actuators coupled to a given card are controlled with a single controller. In one embodiment, a control program, such as a looping control program, is downloaded to the firmware controller 214. Those of skill in the art will understand how to create and use a looping program after understanding the present disclosure. The looping program, in response to setting of various relays 216 on a control board 218 will control the actuators 136a,b to sequentially remove and then insert the board, with the process looping or repeating a desired number of times, e.g., as determined by the relay settings 216 controlled by logic and memory devices 222 on the control board 218. Programming and/or data may be downloaded into the logic memory 222 from programs or data input into a PC or other computer 224 which communicates, e.g., via a Telnet connection 226 through an RS 232 connector 228 on the board 218. Those of skill in the art will understand how to select, fabricate and use the control system and components as depicted in FIG. 2 after understanding the present disclosure.

In one embodiment the PC runs a program which may open or close a relay on a serially connected board. More than one board may be provided and preferably each board has multiple relays. For example, in connection with testing a device which holds 17 boards, an embodiment of the present invention can include three boards, each containing 8 relays. The controller monitors the relay inputs coming from the relay board. Opening or closing the relay that is wired directly to the actuator controller causes the linear actuator to either push or pull the card.

Figure 6:
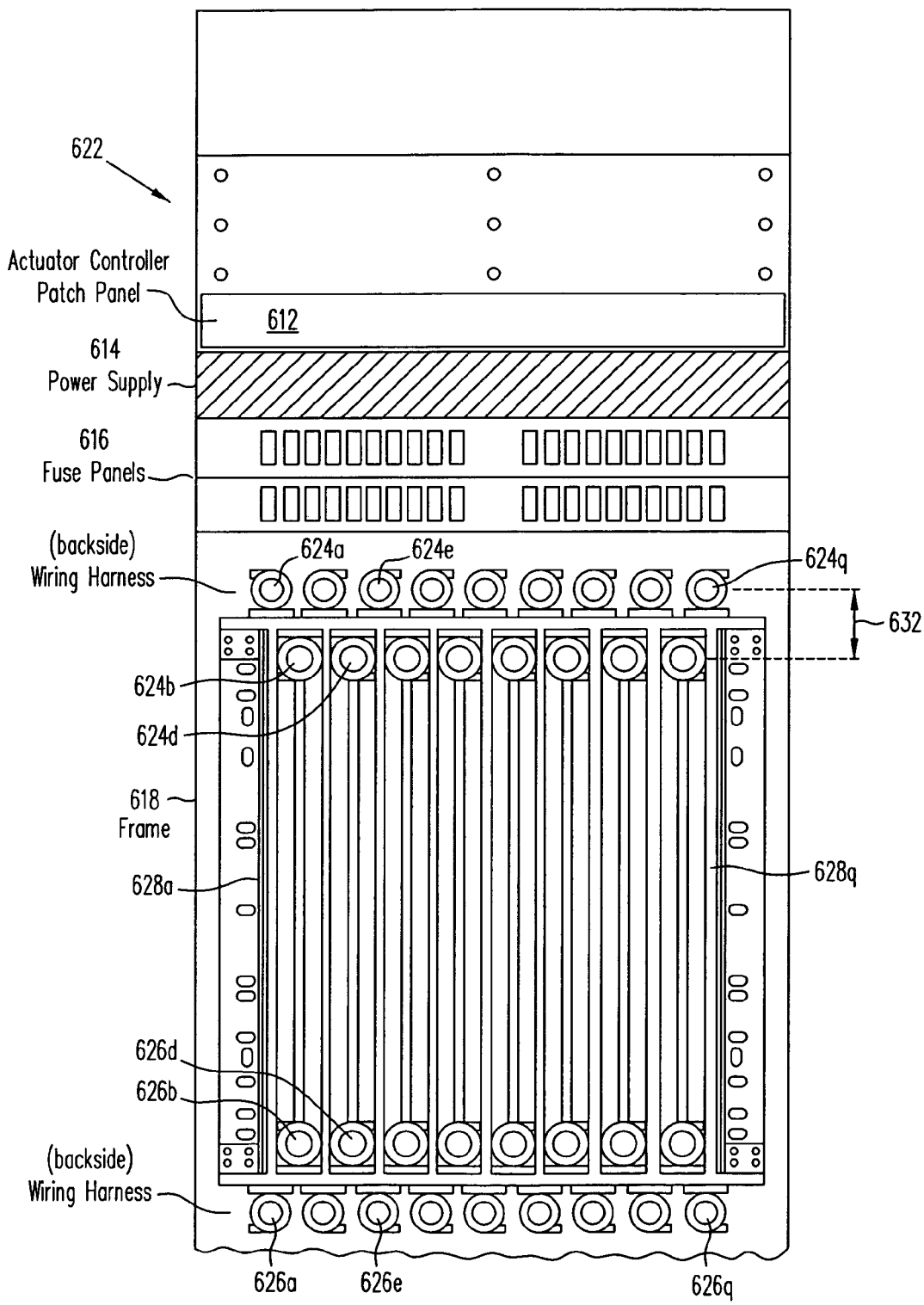
FIG. 6 is a front view of a rack mounted testing system according to an embodiment of the present invention.

FIG. 6 illustrates an example of a rack-mounted system configured for pulling 17 boards. In the depicted configuration, an actuator controller patch panel 612, a power supply 614 and fuse panels 616 are positioned adjacent the frame 618 in a standard equipment rack 622. In the depicted configuration, seventeen pairs of linear actuators 624a–q, 626a–q are coupled between the frame 618 and card pullers 628a–q, each of which is coupled to a card (not shown in FIG. 6). As seen in FIG. 6, preferably, adjacent pairs of actuators are offset a distance 632 with respect to neighboring actuators, to achieve the desired lateral actuator spacing.

In one embodiment, they system is configured with boards to substantially modularize the linear actuator wiring, which is believe to increase ease of setup/maintenance. The modularizing boards connect to the linear actuators via, e.g. RJ45 connectors. For an embodiment which is configured to push/pull up to 17 boards, each modularizing board has 17 RJ45 connectors and two 68 pin AMP connectors. Accordingly, a total of 204 wires (six wires per actuator times 34 actuators) is condensed into three AMP cables. Furthermore it is relatively easy to unclip linear actuators or their associated controllers at any time. In one embodiment a first modularizing board connects to 17 controllers, via RJ45 connectors, a second modularizing board connects to the first modularizing board via an AMP cable, and also connects to the top 17 actuators via RJ45 connectors. A third modularizing board connects to the second modularizing board via another AMP cable and also connects to the bottom 17 linear actuators via RJ45 connectors.

Preferably, the program running on the PC has serial connections for controlling not just the card puller, but also for communicating with a test set (that measures service disruption) and preferably also communicates with the Device Under Test. In one embodiment, the program running on the PC is also responsible for creating and saving a text file that lists each incurred service disruption and logs the total number of pulls per slot for the card puller being used (e.g. for maintenance/wear purposes).

Figure 4:
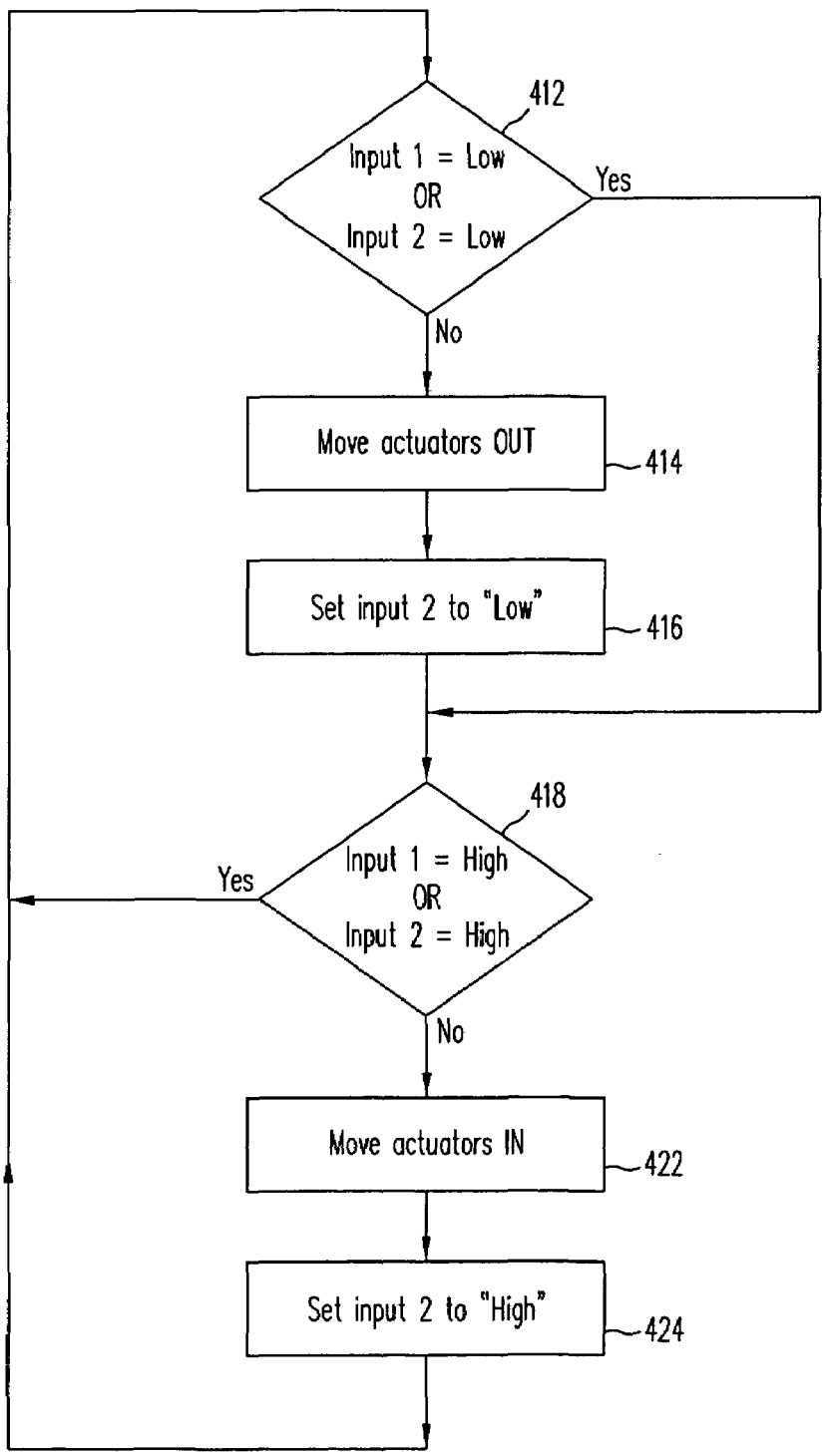
FIG. 4 is a flowchart illustrating an example of looping firmware that can be used in accordance with an embodiment of the present invention.

FIG. 4 provides a flowchart for an example of firmware that can be used in accordance with an embodiment of the present invention. In this example the firmware can receive a high or low signal on either of two inputs which indicate the current position of an actuator. L/H signals at the inputs (Input 1=Low, Input 2=High) is indicative that the actuator is in the "in" or card-inserted position. H/L signals at the inputs is indicative that the actuator is in the "out" or card-pulled position. Unless L/L signals are at the input 412 (in which case, the program skips to the next decision 418) the firmware moves the actuators out 414, after which terminal 2 is set to "low" 416. Then, Unless H/H signals are at the inputs 418 (in which case, the program loops to the first decision 412), the firmware moves the actuators in 422, sets terminal 2 to "high" and loops back to the first decision 412. The setting of input 1 and checking of input 2 (which is wired to output terminal 2) allows the program to ensure that an "in" movement can only be followed by an "out" movement and that an "out" movement can only be followed by an ":in" movement. Preferably the system is configured such that in the event of power loss, all motors move to the out position.

Figure 3:
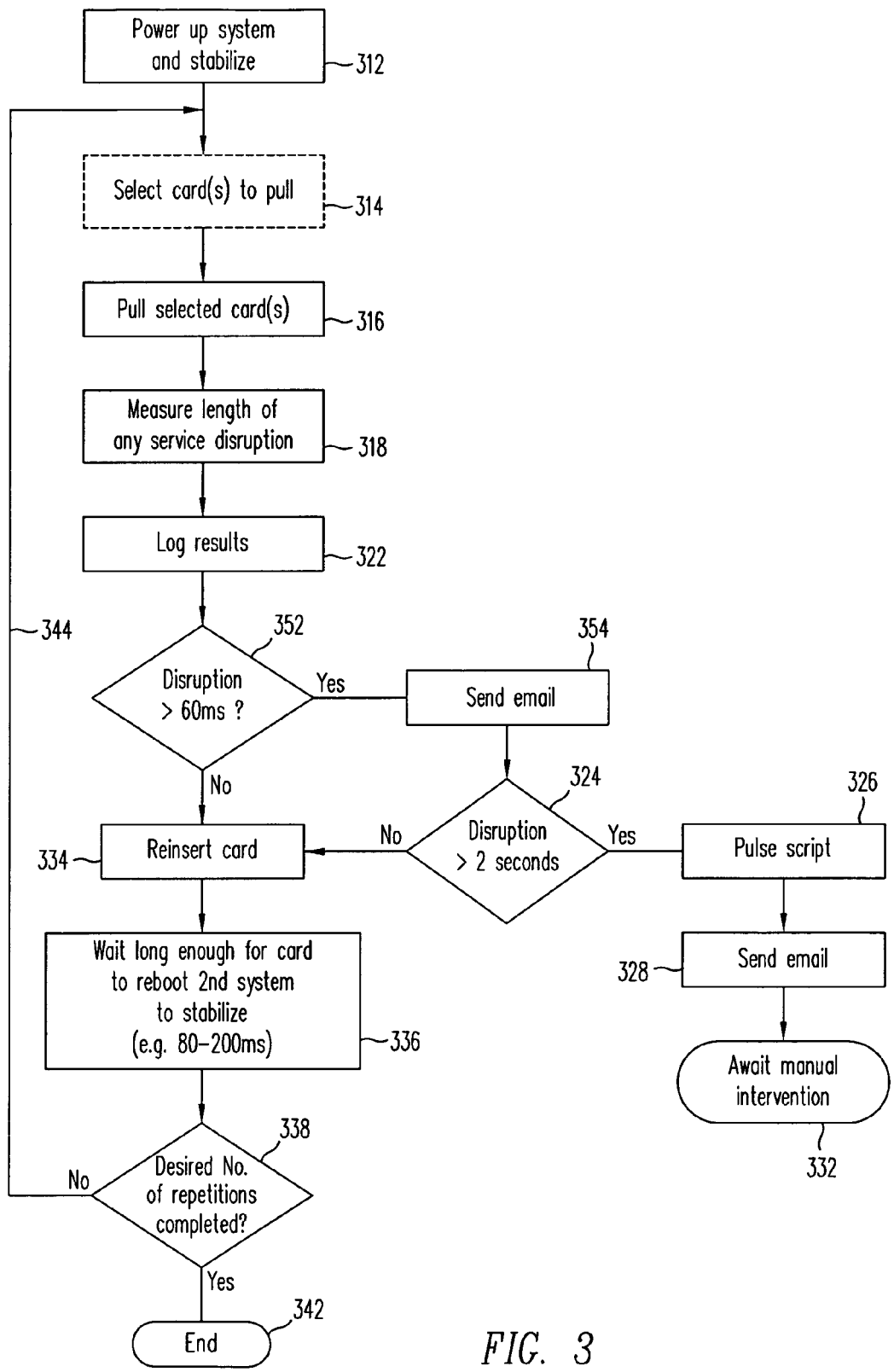
FIG. 3 is a flowchart of a controlled process according to an embodiment of the present invention.

In practice, as depicted in FIG. 3, after the electronic device 112 has been powered up and stabilized 312, the control system as depicted in FIG. 2 may be configured to select which of a plurality of cards in the chassis are to be pulled 314. If only one card is coupled to the insertion/removal device or actuator, the selection step is unnecessary. In any case, the relays 216 are set so as to cause the firmware controller 214 to send control signals to the linear actuators 136a,b causing them to retract 154 so as to pull the card 316.

Measurement apparatus 172 (FIG. 1) measures the length of any service disruption 318 which occurs as a result of the card removal. As noted above, when the card 116 is part of a protection group, other cards in the group are preferably configured to relatively rapidly take over some or all functions of the removed card in such a fashion as to maintain functionality of the electronic device. There may, however, be a short period of service or functionality disruption before functionality is restored by the remaining cards in the protection group. The results from this test cycle are logged 322. In the depicted embodiment, after each test, it is determined whether the disruption length exceeds a predetermined threshold 324. In one embodiment, two tests may be performed, typically about 7 seconds apart. If a disruption exceeds a first threshold, such as a threshold of about 60 milliseconds 352, the disruption is logged, an email or other notification is sent 354 and the testing procedure continues. If a disruption exceeds a second threshold, such as a threshold of about 2 seconds (generally indicative that total signal outage has occurred), the program or script which is controlling the testing is paused 326 and a notification is output such as sending an e-mail notification 328 to operators, and the system will remain in a paused configuration awaiting manual intervention 332.

In the absence of a disruption exceeding the threshold, the firmware controller 214 will, after the measurement, 318, reinsert the card 334 (preferably within about one second after the card is pulled) by sending appropriate extension commands to the actuators 136a,b. After the card is reinserted, the system will wait a period long enough for the reinserted card to reboot and for the electronic device 112 to stabilize 336. This amount of time will depend on the particular electronic devices being tested. In the testing of a telecommunications switch, a period of about 80 to 200 milliseconds is believed to be operable in many situations. The wait 336 can be for a predetermined period or can be terminated in response to a condition indicative of system stabilization and/or card reboot status. If the desired number of insertions/removal repetitions have been completed 338, the test cycle ends 342. Otherwise, the procedure loops 344 to perform another card pull 316 and subsequent steps.

In one embodiment, service disruption checking is concurrently determined by the test set, but is not retrieved by the program until after the card-puller re-inserts the card.

In light of the above description, a number of advantages of the present invention can be seen. The present invention provides a manner in which IC boards or cards can be repeatedly removed from and inserted into an electronic device in a substantially automatic fashion without the need for human intervention at each insert/remove cycle. The present invention makes it possible to implement such a system in a relatively inexpensive fashion, avoiding undesirably high maintenance, fabrication, design and operation costs. Preferably, the system has low infrastructure requirements such as preferably avoiding the need for providing hydraulic or pneumatic infrastructure. The system is substantially modular with card pull-push units duplicable as necessary for pulling various numbers of cards singly or simultaneously. The actuator bracket is readily modifiable to accommodate cards inserted into differently-shaped or differently oriented shelves or slots. The system is reliable and if desired can be implemented using only a single type of moving part, namely the actuators. In view of the reliability, the system can be left to operate (e.g., via a script automation program) unattended and can perform multiple hundreds or thousands of cycles without error. The system is accurate, allowing cards to be positioned (pushed or pulled) to within thousandths of an inch accuracy. The system is safe and avoids the potential for cards being mispositioned such as being accidentally pushed through the backplane.

A number of variations and modifications of the invention can be used. It is possible to use some aspects of the invention without using others. For example, it is possible (although not necessarily desirable) to provide for automatic insertions/removal operation without eliminating the need for human intervention for each cycle. Although depicted embodiments show a particular orientation of cards with respect to actuators, brackets and electronic devices, other orientations or positions can be used as will be understood by those of skill in the art after understanding the present invention. Although a particular manner of controlling the linear actuators is depicted and described in connection with FIG. 2, other control systems can also be used including a hardware controller such as one or more application specific integrated circuits (ASICs) or programmable logic arrays (PLA) and/or controlling a firmware controller 214 in real-time directly by the computer 224, and the like.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease and\or reducing cost of implementation. The present invention includes items which are novel, and terminology adapted from previous and/or analogous technologies, for convenience in describing novel items or processes, do not necessarily retain all aspects of conventional usage of such terminology.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method for integrated circuit (IC) board insertion/removal with respect to an electronic device having receptors mating with connectors of the IC board, comprising:

mounting a bracket in a substantially fixed position with respect to said electronic device;

coupling at least a first actuator in a position with respect to said bracket and also coupling said first actuator to at least a first IC board, said first IC board being in a first board position with respect to said electronic device, wherein at least a first set of said connectors of said first IC board, in said first board position, mate with a first set of said receptors in said electronic device, said first actuator being movable between a first actuator position, in which said first IC board is in said first board position, and a second actuator position, in which said first IC board is moved to a second board position wherein said first set of connectors is spaced from said first set of receptors; and operatively coupling a controller to said actuator; and controlling said actuator, using said controller, to perform a plurality of cycles, each cycle including movement of said first actuator from said first actuator position to said second actuator position and from said second actuator position to said first actuator position, to move said first IC board from said first board position to said second board position and from said second board position to said first board position.

2. The method of claim 1, further comprising measuring a duration of service disruption of said electronic device following movement of said board from said first board position to said second board position.

3. The method of claim 2, further comprising storing information related to said duration.

4. The method of claim 2, further comprising interrupting said plurality of cycles when said duration exceeds at least a first threshold.

5. The method of claim 1, further comprising coupling a second actuator in a position with respect to said bracket and coupling said second actuator to said first IC board, said first actuator and said second actuator coupled, respectively, to spaced-apart positions with respect to said first IC board.

6. The method claim 1, further comprising coupling at least a second actuator in a position with respect to said bracket and also coupling said second actuator to a second IC board of said electronic device; and operatively coupling said controller to said second actuator to move said second board from a third board position wherein a second set of connectors on said second IC board are coupled with a second set of receptor in said electronic device, to a fourth board position wherein said second set of connectors of second IC board are spaced from said second set of receptors in said electronic device.

7. The method of claim 6, wherein said first IC board and said second IC board are moved substantially simultaneously.

8. The method of claim 6, wherein said first IC board and said second IC board are moved sequentially.

* * * * *